United States Patent
Zanchi et al.

(10) Patent No.: US 10,790,833 B1
(45) Date of Patent: Sep. 29, 2020

(54) CLOCK DATA RECOVERY CIRCUIT

(71) Applicant: The Boeing Company, Chicago, IL (US)

(72) Inventors: Alfio Zanchi, Seattle, WA (US); Parham Khajeh Hesamaddin, Irvine, CA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 16/833,254

(22) Filed: Mar. 27, 2020

(51) Int. Cl.
| | |
|---|---|
| *H04L 7/033* | (2006.01) |
| *H03L 7/08* | (2006.01) |
| *H03L 7/099* | (2006.01) |
| *H03L 7/087* | (2006.01) |
| *H03L 7/23* | (2006.01) |

(52) U.S. Cl.
CPC .......... *H03L 7/0807* (2013.01); *H03L 7/087* (2013.01); *H03L 7/0993* (2013.01); *H04L 7/033* (2013.01); *H03L 7/23* (2013.01)

(58) Field of Classification Search
CPC ..... H03L 7/0807; H03L 7/087; H03L 7/0993; H03L 7/033; H03L 7/23
USPC ........ 375/371, 373, 355, 375, 376; 327/141, 327/155
See application file for complete search history.

(56) References Cited

U.S. PATENT DOCUMENTS

| | | | |
|---|---|---|---|
| 2005/0030001 A1* | 2/2005 | Jasa ...................... | H03L 7/0893 324/76.53 |
| 2011/0075781 A1* | 3/2011 | Kenney ................... | H03L 7/235 375/376 |

OTHER PUBLICATIONS

Yin, W. et al. "A TDC-Less 7 mW 2.5 Gb/s Digital CDR With Linear Loop Dynamics and Offset-Free Data Recovery," IEEE Journal of Solid-State Circuits, vol. 46, No. 12, Dec. 2011, 11 pages.
Palermo, S., Lecture 30: "CDRs" lecture notes, ECEN689: Special Topics in High-Speed Links Circuits and System, Texas A&M University, Spring 2010, 21 pages.
Hogge C., "A Self Correcting Clock Recovery Circuit," Journal of Lightwave Technology, vol. LT-3, No. 6, Dec. 1985, 3 pages.
Kratyuk V. et al., "A Design Procedure for All-Digital Phase-Locked Loops Based on a Charge-Pump Phase-Locked Loop Analogy," IEEE Transactions on Circuits and Systems-II: Express Briefs, vol. 54, No. 3, Mar. 2007, 5 pages.

(Continued)

*Primary Examiner* — Tesfaldet Bocure
(74) *Attorney, Agent, or Firm* — Alleman Hall Creasman & Tuttle LLP

(57) ABSTRACT

A clock data recovery circuit is disclosed. The clock data recovery circuit includes a bit stream data rate divider and a digital phase-locked loop including a linear phase detector. The bit stream data rate divider is configured to divide a frequency of a serial data stream by a designated division factor to generate a divided serial data stream. The linear phase detector is configured to compare phases of the divided serial data stream and a feedback signal within the digital phase-locked loop and output an UP signal associated with phase lagging and a DOWN signal associated with phase leading of the feedback signal versus the divided serial data stream. The digital phase-locked loop is configured to output a clock signal having a phase based on a digital difference between a digitized-UP signal derived from the UP signal and a digitized-DOWN signal derived from the DOWN signal.

20 Claims, 6 Drawing Sheets

(56) References Cited

OTHER PUBLICATIONS

Larsson P., "A 2-1600-MHz CMOS Clock Recovery PLL with Low-V dd Capability," IEEE Journal of Solid State Circuits, vol. 34, No. 12, Dec. 1999, 10 pages.

Tall, N., et al., "An all-digital clock and data recovery circuit for low-to-moderate data rate applications," Proceedings of the 2011 18th IEEE International Conference on Electronics, Circuits, and Systems, Beirut, Lebanon, Dec. 11, 2011, 4 pages.

M. Perrott, et el., "A 2.5Gb/s multi-rate 0.25 µm CMOS CDR utilizing a hybrid analog/digital loop filter", in Proceedings of the International Solid-State Circuits Conference (ISSCC), 2006, pp. 328-329.

Pavan, S. et al., "An Analytical Solution for a Class of Oscillators, and Its Application to Filter Tuning," IEEE Transactions on Circuits and Systems-I: Fundamental Theory an dApplications, vol. 45, No. 5 May 1998, 10 pages.

Razavi, B., "Design of Monolithic Phase-Locked Loops and Clock Recovery Circuits—A Tutorial," Wiley-IEEE Press, Apr. 1996, 39 pages.

Sonntag, J. et al., "A Monolithic CMOS 10MHz DPLL for Burst-Mode Data Retiming," ISSCC 90, Session 11, Feb. 16, 1990, 3 pages.

Whilmhurst, T., "Signal recovery from noise in electronic instrumentation," Institue of Physics Publishing Bristol and Philadelphia, First Published 1985, 238 pages.

\* cited by examiner

CLOCK DATA RECOVERY CIRCUIT

FIELD

The present disclosure relates generally to the field of electronic circuitry, and more specifically to a clock data recovery circuit including a digital phase-locked loop.

BACKGROUND

Serial data communication is a prevalent form of electronic communication implemented across various electronic systems. For example, such serial data communication can be conducted between electronic components on different integrated circuits, i.e., chip-to-chip serial data communication. As another example, such serial data communication can be conducted between electronic components on different printed circuit boards, i.e., board-to-board serial data communication. As yet another example, such serial data communication can be conducted between electronic components of different remote hosts.

Serial data communication was once hindered by having limited data rates. However, various optimizations have been implemented over time to increase such data rates. One example of such an optimization includes extracting an embedded clock signal from the serial data stream itself, without the need for a separate clock lane. While extremely efficient, the clockless transmission of serial data relies on a robust retrieval of the variable data rate (frequency) and exact time occurrence of the serial data bits (phase) by a circuit receiving the serial data stream.

SUMMARY

A clock data recovery circuit is disclosed. The clock data recovery circuit includes a bit stream data rate divider and a digital phase-locked loop including a linear phase detector. The bit stream data rate divider is configured to divide a frequency of a serial data stream by a designated division factor to generate a divided serial data stream. The linear phase detector is configured to compare phases of the divided serial data stream and a feedback signal within the digital phase-locked loop, and output an UP signal associated with phase lagging and a DOWN signal associated with phase leading of the feedback signal versus the divided serial data stream. The digital phase-locked loop is configured to output a clock signal having a phase based on a digital difference between a digitized-UP signal derived from the UP signal, and a digitized-DOWN signal derived from the DOWN signal.

The features, functions, and advantages that have been discussed can be achieved independently in various embodiments or may be combined in yet other embodiments, further details of which can be seen with reference to the following description and drawings.

DETAILED DESCRIPTION

Figure 1:
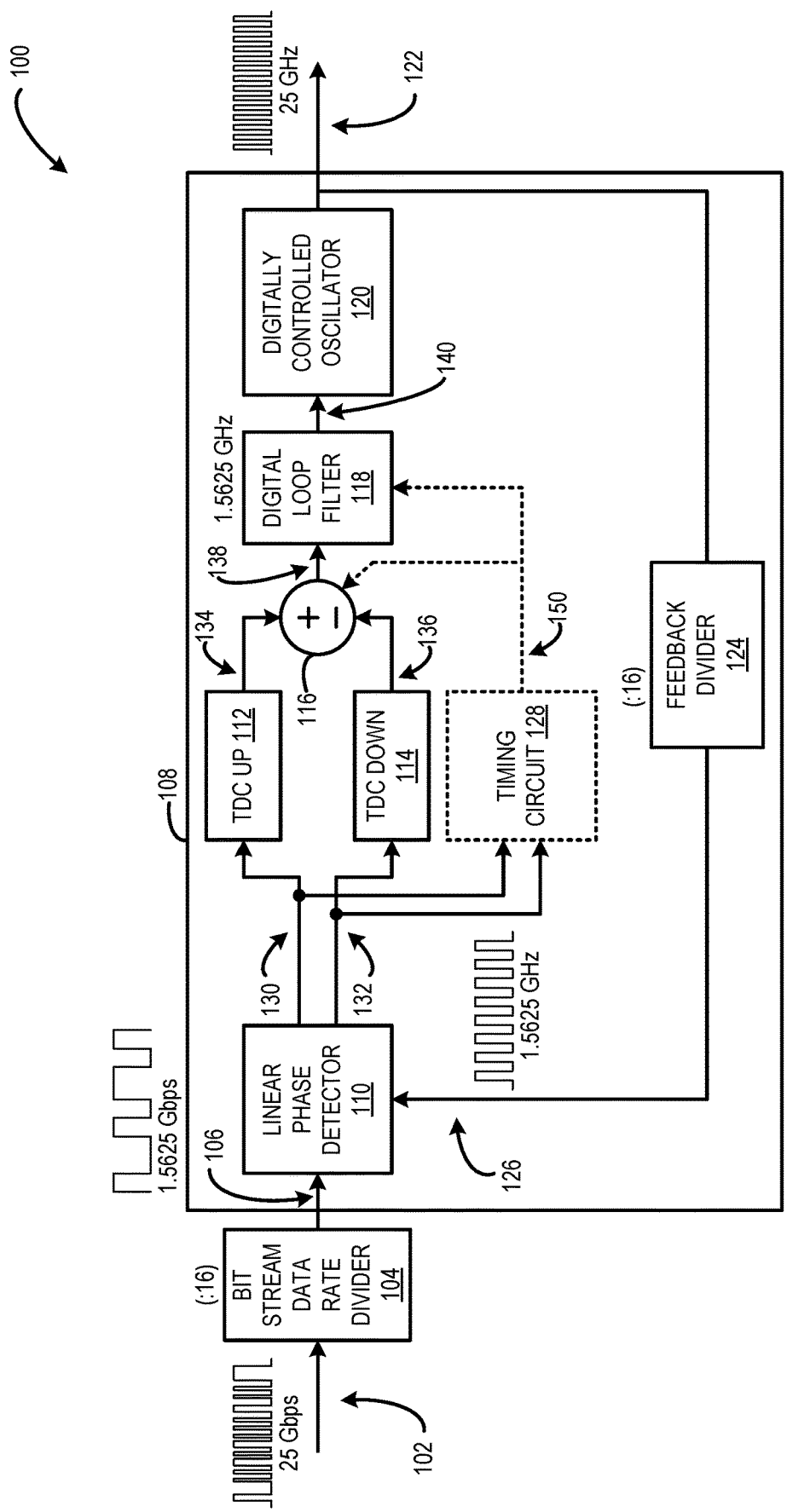
FIG. 1 is a diagrammatic representation of an exemplary embodiment of a clock data recovery circuit.

Clock data recovery circuits may be used to retrieve (1) variable data rate (frequency) and (2) time occurrence (phase) of the serial data bits from e.g., a clockless transmission of a serial data stream. One type of prior clock data recovery circuit is based on phase interpolators that "track" the correct phase of the received data by continuously revolving across a number of phase-skewed signals, as produced by an open-loop delay line. This type of open-loop circuit requires multiple taps, or access points, in order to allow selection of the most accurate phase at a certain time in the process of bitstream data recovery. The granularity of the solution provided by this type of open-loop circuit can be improved by increasing the number of taps in the circuit. However, increasing the number of taps also complicates the delay line leading to an increased footprint and cost of the circuit. Moreover, such an open-loop solution cannot track shifts in either frequency or phase of the input stream, which drifts throughout operation due to temperature, aging, and/or exposure to radiation.

In another example, phase interpolator-based clock data recovery circuits can be implemented in closed-loop form by using a delay line locked in a delay locked loop (DLL). Such closed-loop circuits are configured to internally process serial data at speeds that are identical to a high data rate of the input itself. To enable such high-speed processing, the DLL circuits either employ analog circuitry or simplified digital circuitry, both of which can present issues. In the former case of analog circuitry, charge pumps with RC discrete components' filters are typically employed to achieve high-speed operation. However, such analog components are prone to undesirable transients upon heavy ion radiation strikes. In other words, such analog components are not radiation-hardened. Additionally, due to a significant physical size requirement, the analog components make semiconductor integration difficult. In the latter case of simplified digital circuitry, "bang-bang" digital circuitry is often employed to achieve high-speed operation. However, such bang-bang digital circuitry normally requires specific input signal noise characteristics to "scramble" the signals to make them usable without major quantization side-effects, which can engender limit cycle regimens and cause system destabilization. Additionally, both of these types of closed-loop DLL interpolator circuits can suffer from a periodic "phase jump" that may affect the quality of the signal recovery.

Another type of prior clock data recovery circuit is based on a phase-locked loop (PLL) that utilizes a phase detector at the input and processes the serial data at speeds identical to the input data rate itself. Such a phase-locked loop-based circuit also leverages bang-bang type digital logic to afford operation at high data rates. Such phase-locked loop-based circuits drive the frequency and phase convergence of an autonomous, internal voltage-controlled oscillator often through an analog voltage created by lowpass-filtering the phase detector output with an integrating charge pump. Other digital implementations adopt data conversion (analog to digital and/or digital to analog) with substantial use of analog circuits. However, employing such analog components again can make the circuit prone to large, long-duration undesirable transients upon heavy ion radiation strikes. In other words, such analog components are not radiation-hardened.

Additional techniques have been proposed to enhance the degree of digital content of the recovery circuit, such as decision-directed loops that make use of signal estimates, in cases of high signal quality or signal-to-noise (SNR) ratio. Such techniques are significantly more sophisticated and therefore either add more signal quality requirements or were solved by resorting to additional more complex circuits at the expense of design time, silicon area, power consumption, and radiation hardness.

Accordingly, the present disclosure relates to embodiments of a clock data recovery circuit that variously can provide for a compact, low-power and low-noise circuit for the extraction of frequency and phase information from clockless transmission of a serial data stream. The clock data recovery circuit includes a digital phase-locked loop that can be implemented so as to be resistant to long-duration upsets under radiation. In particular, the radiation-hardened nature of the digital phase-locked loop can enable the digital phase-locked loop to maintain a correct recovered clock "frozen" even in the case of temporary data loss for a considerable time. Moreover, in some embodiments, the closed-loop nature of such a clock data recovery circuit is inherently resilient to radiation dose accumulation shifts. To employ such an all-digital architecture in the clock data recovery circuit, however, the internal signal speed of the digital phase-locked loop typically must be reduced, to enable the implementation of digital blocks with reasonable wideband operation at a reasonable speed.

FIG. 1 is a schematic representation of an exemplary embodiment of a clock data recovery circuit 100. The clock data recovery circuit 100 is configured to receive a serial data stream 102. The serial data stream 102 can have any suitable data rate. Non-limiting example data rates of the serial data stream include anywhere from 1 Gbps-28 Gbps (Giga-bit per second). The serial data stream 102 can be encoded using any suitable serial encoding scheme. In the illustrated embodiment, the serial data stream 102 has a data rate of 25 Gbps. The serial data stream 102 is clockless, such that timing information is embedded in the serial data stream itself. For example, the serial data stream 102 may be encoded using a clockless protocol, such as 8b10b, 64b66b, 64b80b, and other variants.

The clock data recovery circuit 100 includes a bit stream data rate divider 104 that is configured to receive the serial data stream 102 and divide a frequency of the serial data stream 102 by a designated division factor to generate a divided serial data stream 106 having a data rate that is proportionally less than a data rate of the serial data stream. The designated division factor can be set to any suitable value to produce a divided serial data stream having a data rate that is slow enough for the digital components of the clock data recovery circuit 100 to suitably process data without corruption, for retrieval of frequency and phase information from the serial data stream 102. Non-limiting examples of designated division factors employed by the bit stream divider include 2, 4, 6, 8, 10, 12, or 16. In the illustrated embodiment, the 25 Gbps date rate of the serial data stream 102 is divided by a designated division factor of 16 to produce a divided serial data stream with a data rate of 1.5625 Gbps that is slow enough for the digital components of the clock data recovery circuit 100 to process. Note that the bit stream data rate divider 104 does not perform a "blind" decimated data rate reduction, which would simply lose information, as most samples of the serial data stream would be ignored. Instead, the act of dividing the frequency of the serial data stream 102 includes counting the edges in the serial data stream 102 to thereby provide a form of timing by at least recording each edge.

The divided serial data stream 106 is provided as input to a digital phase-locked loop 108. The digital phase-locked loop 108 includes a linear phase detector 110, an UP time-to-digital converter 112, a DOWN time-to-digital converter 114, a subtractor 116, a digital loop filter 118, a digitally controlled oscillator 120, and a feedback divider 124. The clock and data recovery circuit 100 including the digital phase-locked loop 108 may belong to a class of self-synthesizing local clock circuits, i.e., that do not require any local clock signals, which can (1) simplify the system design and avoid frequency pulling between a local clock and other oscillating circuits and (2) allow for the digital phase-locked loop 108 to employ digital components that can be configured to be radiation-hardened.

The linear phase detector 110 is configured to receive the divided serial data stream 106 and a feedback signal 126 provided by the feedback divider 124 of the digital phase-locked loop 108 as inputs. The feedback divider 124 is configured to output the feedback signal 126, such that the feedback signal 126 has a same frequency as the data rate of the divided serial data stream 106. The operating dynamics of the linear phase detector 110 may be such that it is desirable for both inputs to have a substantially 50% duty-cycle. As such, the bit stream data rate divider 104 and the feedback divider 124 can each include at least one toggle flip flop configured to provide the divided serial data stream 106 and the feedback signal 126 as inputs to the linear phase detector 110 with a substantially 50% duty-cycle. In one example, the bit stream data rate divider 104 includes a :2N divider structure built as a cascade of toggle flip flops. Such a structure can also perform division operations in a suitably fast manner. Moreover, adopting an even division factor can allow for design flexibility, such that the bit stream data rate divider 104 can employ a pulse-type counter divider in conjunction with a downstream :2 toggle flip flop in some embodiments.

The linear phase detector 110 is configured to compare a phase of the divided serial data stream 106 with a phase of a feedback signal 126 within the digital phase-locked loop 108, and output an UP signal 130 associated with phase lagging and a DOWN signal 132 associated with phase leading of the feedback signal 126 versus the divided serial data stream 106. The linear phase detector 110 is configured to steer the digital phase-locked loop 108 based on a directionality (i.e., UP/DOWN direction) depending on an averaged relative duration of the phase leading/phase lagging of the outputs of the linear phase detector 110. Additionally, the averaged relative duration of the phase leading/phase lagging of the outputs of the linear phase detector 110 dictate a magnitude of steering to phase-align the serial divided serial data stream 106 and the feedback signal 126.

Figure 2:
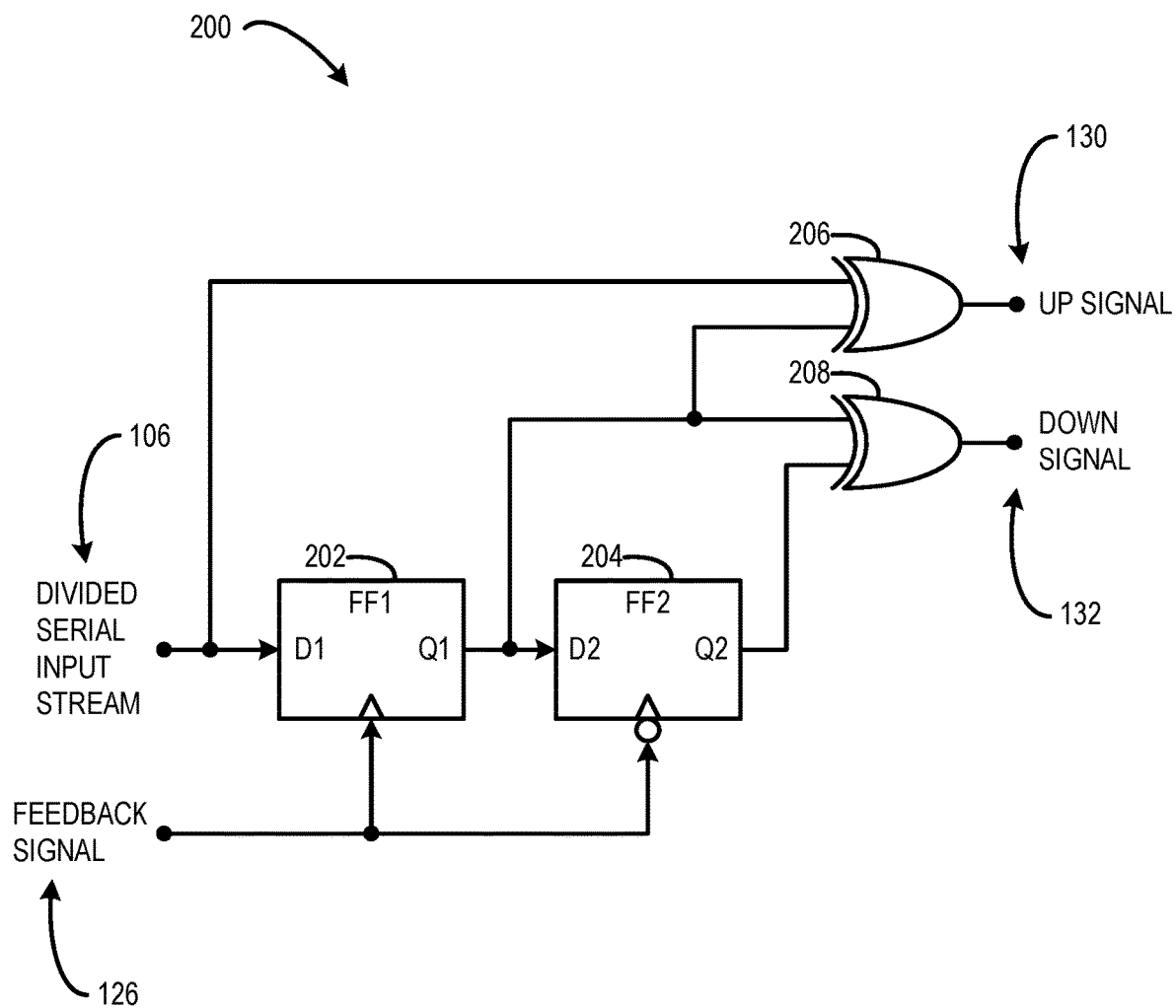
FIG. 2 is a diagrammatic representation of an exemplary embodiment of a Hogge phase detector.

In some embodiments, the linear phase detector 110 includes a Hogge phase detector. FIG. 2 is a schematic representation of an exemplary embodiment of such a Hogge phase detector 200. For example, the Hogge phase detector 200 can embody the linear phase detector 110 in the clock data recovery circuit 100 shown in FIG. 1. The Hogge phase detector 200 includes a first D-type flip flop 202, a second D-type flip flop 204, a first exclusive OR (XOR) gate 206, and a second exclusive OR (XOR) gate 208. The first and second D-type flip flops are configured such that the output changes at the rising edge of the clock, and if the input changes at other times, the output will be unaffected.

The first D-type flip flop 202 is configured to receive the divided serial data stream 106 as input (D1) and the feedback signal 126 as the clock signal. The output (Q1) of the first D-type flip flop 202 is provided as input (D2) to the second D-type flip flop 204. An inversion of the feedback signal 126 is provided as the clock signal for the second D-type flip flop 204. The first XOR gate 206 is configured to receive the divided serial data stream 106 and the output (Q1) of the first D-type flip flop 202 as inputs and output the UP signal 130. The second XOR gate 208 is configured to receive the output (Q1) of the first D-type flip flop 202 and the output (Q2) of the second D-type flip flop 204 as inputs and output the DOWN signal 132.

The Hogge phase detector 200 directly compares the phases of the divided serial data stream 106 and the feedback signal 126 in the following manner. After a change in the state of the divided serial data stream 106, the D1 input and Q1 output of the first D-type flip flop 202 are no longer equal, causing the output of the first XOR gate 206 to go high. The output of the first XOR gate 206 remains high until the next rising edge of the clock, at which time the new state of the divided serial data stream is clocked through the first D-type flip flop 202, eliminating the inequality between the D1 and Q1 lines of the first D-type flip flop 202. At the same time, the output of the second XOR gate 208 goes high, because the D2 and Q2 lines of the second D-type flip flop 204 are now unequal. The output of the second XOR gate 208 remains high until the next falling edge of the clock, at which time the divided serial data stream's new state is clocked through the second D-type flip flop 204. In this way, the Hogge phase detector 200 is configured to output doublets of sequentially correlated UP/DOWN pulses corresponding to the UP signal 130 and the DOWN signal 132.

Figure 3:
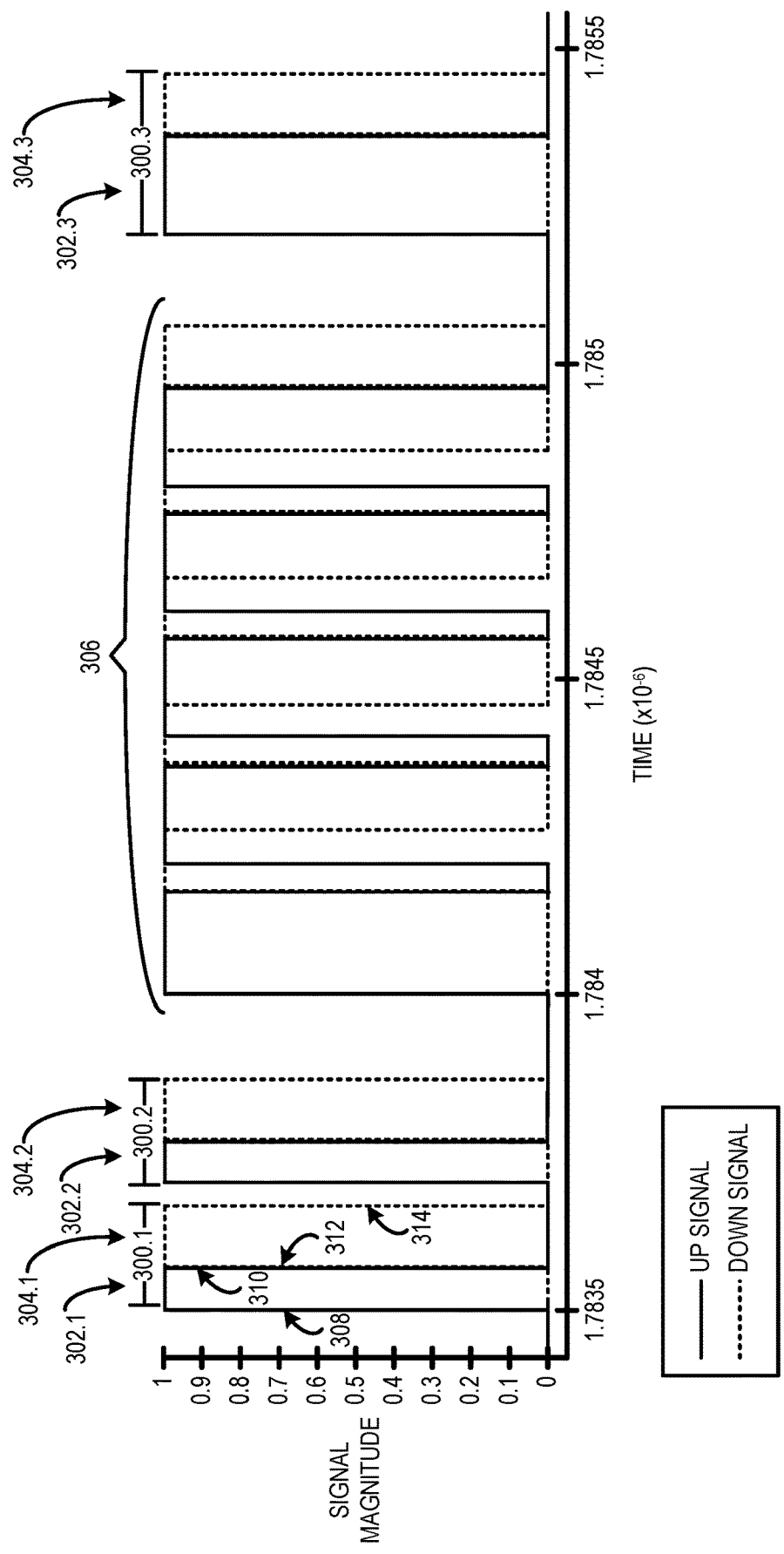
FIG. 3 is a timing diagram illustrating exemplary doublets of sequentially correlated UP/DOWN pulses output by a linear phase detector.

FIG. 3 illustrates a plurality of exemplary doublets 300 (e.g., 300.1, 300.2, 300.3) of sequentially correlated UP/DOWN pulses output by the Hogge phase detector 200. For each doublet 300, the UP signal 130 includes an UP pulse 302 generated responsive to a change in state of the divided serial data stream 106 and a reset responsive to a next rising edge of the feedback signal 126 following that change in state of the divided serial data stream 106. Furthermore, for each doublet 300, the DOWN signal 132 includes a DOWN pulse 304 generated responsive to the reset of the pulse included in the UP signal 130 and a reset responsive to a next falling edge of the feedback signal 126 following the reset of the pulse included in the UP signal 130. As one example, the doublet 300.1 includes an UP pulse 302.1 and a subsequent DOWN pulse 304.1. The UP pulse 302.1 includes a rising edge 308 and a falling edge/reset 310. The DOWN pulse 304.1 includes a rising edge 312 and a falling edge/reset 314. Note that the falling edge/reset 310 of the UP pulse 302.1 occurs substantially at the same time as the rising edge 312 of the DOWN pulse 304.1

In the depicted example, when the divided serial data stream 106 and the feedback signal 126 are phase-aligned, and the divided serial data stream 106 is a regular high/low clock sequence, since the feedback signal 126 has a 50% duty cycle the output of the second XOR gate 208 is a positive pulse with a width equal to half the clock sequence period for each data transition. The output of the first XOR gate 206 is also a positive pulse for each data transition, but its width depends on the phase error between the divided serial data stream 106 and the feedback signal 126. Further, the phase error can be obtained by comparing the widths of pulses of the UP signal 130 output from the first XOR gate 206 and the DOWN signal 132 output from the second XOR gate 208.

When the divided serial data stream 106 is leading ahead of the feedback signal 126, the output of the Hogge phase detector 200 has a positive (mostly UP) average value, that steers the digital phase-locked loop 108 toward a net increase in frequency of the feedback signal 126, such that the frequency of the feedback signal accelerates toward phase-aligning with the divided serial data stream 106. Conversely, when the divided serial data stream 106 is lagging behind the feedback signal 126, the output of the Hogge phase detector 200 has a negative (mostly DOWN) average value that steers the digital phase-locked loop 108 toward a net decrease in frequency of the feedback signal 126, such that the frequency of the feedback signal decelerates toward phase-aligning with the divided serial data stream 106. When the divided serial data stream 106 and the feedback signal 126 are phase-aligned, the output of the Hogge phase detector 200 has zero average value (UP and DOWN are in balance), and the Hogge phase detector 200 maintains the status quo in the loop 108. When no transitions are recorded on the divided serial data stream 106, moreover, the XOR gates 206 and 208 ensure that the Hogge phase detector 200 operates in an IDLE state, where neither UP nor DOWN signal pulses are issued at its output, and consequently no change in directionality is imparted to the digital phase-locked loop 108. In other words, the IDLE state prevents the digital phase-locked loop 108 from taking erroneous phase alignment action based on being steered in the wrong direction when simply no activity is recorded in front of the Hogge phase detector 200. The existence of the IDLE state in the Hogge phase detector 200 prevents the digital phase-locked loop 108 from being slowed down just out of sheer lack of edges in the divided serial data stream 106. Instead, the digital phase-locked loop 108 only takes corrective action upon asserted UP/DOWN directions that are actually meaningful to operation of the clock data recovery circuit 100. In other words, the IDLE state of the Hogge phase detector 200 mitigates any impact of the random spacing of edges that is an inherent characteristic stemming from the random nature of the divided serial data stream 106.

The Hogge phase detector is provided as a non-limiting example of a linear phase detector providing both directionality and magnitude of the error signal to loop 108 that can be employed in the clock data recovery circuit 100, and other types of linear phase detectors can be contemplated without departing from the present disclosure.

Returning to FIG. 1, since the UP signal 130 and the DOWN signal 132 in the present example both contribute to steering the digital phase-locked loop 108 via equally-weighted time averages, each signal is digitized separately via a matched pair of time-to-digital converters. In particular, the exemplary UP time-to-digital converter 112 is configured to digitize a duration of the UP signal to generate a digitized-UP signal 134 that is registered responsive to termination of the UP signal (i.e., a reset of the UP pulse within a doublet). Further, the DOWN time-to-digital converter 114 is configured to digitize a duration of the DOWN signal to generate a digitized-DOWN signal 136 that is registered responsive to termination of the DOWN signal (i.e., a reset of the DOWN pulse within a doublet).

The exemplary subtractor 116 is configured to receive the digitized-UP signal 134 and the digitized-DOWN signal 136 and output a digital difference signal 138 representing a signed digital difference between the digitized-UP signal 134 and the digitized-DOWN signal 136.

While the linear phase detector 110 typically outputs doublets well separated from one another, in some cases the pulses of the two signals can be overlapping or completely non-overlapped in time. This can result in "multiple beat" scenarios. For example, multiple beat scenarios may occur either before locking of the digital phase-locked loop 108, or upon transients caused by sudden radiation events. When multiple beat scenarios occur, identifying and differentiating individual doublets may be difficult. These cases can hinder operation of the continuously running, asynchronous digital logic that is downstream of the linear phase detector 110 in the clock data recovery circuit 100. Returning to FIG. 3, a multiple beat scenario is shown at 306. The multiple beat scenario 306 includes overlapping UP pulses and DOWN pulses from different doublets. To accurately process the doublets during multiple beat scenarios, the clock data recovery circuit 100 can be configured to enact various output processing policies.

For example, in some embodiments, the UP time-to-digital converter 112 and the DOWN time-to-digital converter 114 can be configured to recognize a doublet based on the falling edge of either an UP pulse or a DOWN pulse of the doublet. Such a processing policy may only count the last instance of doublet in a multiple beat scenario, leading to loss of precious phase information.

In other embodiments, the clock data recovery circuit 100 optionally may include a timing circuit 128. The timing circuit 128 is configured to synchronize processing of data derived from the UP signal 130 and the DOWN signal 132 by downstream circuits in the clock data recovery circuit 100 via a synchronization signal 150. The timing circuit 128 is configured to generate the synchronization signal 150 responsive to termination of both sequentially correlated UP/DOWN pulses of each doublet.

Figure 4:
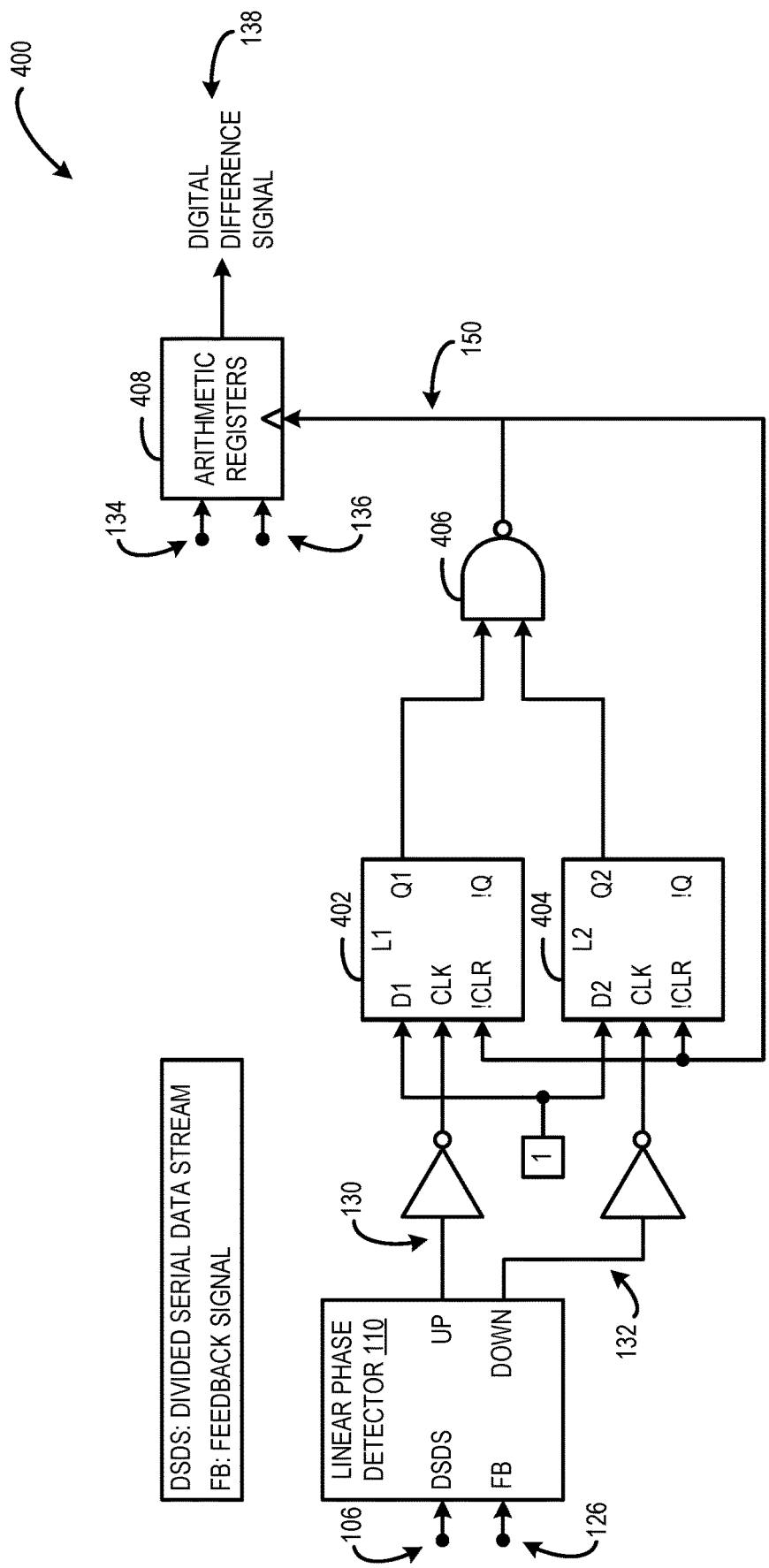
FIG. 4 is a diagrammatic representation of an exemplary embodiment of a timing circuit for synchronization of data processing in a digital phase-locked loop.

FIG. 4 is a schematic representation of an exemplary embodiment of a timing circuit 400, where the timing circuit 128 in the clock data recovery circuit 100 shown in FIG. 1 is shown embodied with the preceding phase detector, and driving the ensuing digital arithmetic of the digital loop filter 118. The exemplary timing circuit 400 includes a first gated D-type latch 402, a second gated D-type latch 404, and a NAND gate 406. The first gated D-type latch 402 is configured to receive the UP signal 130 output from the linear phase detector 110 based on termination of an UP pulse. The second gated D-type latch 404 is configured to receive the DOWN signal 132 output from the linear phase detector 110 based on termination of a DOWN pulse. The latches 402 and 404 are configured to detect the two, sequentially correlated UP/DOWN pulses of each doublet and generate a synchronization pulse 150 via the NAND gate 406 when both of the pulses have been latched in the respective latches 402 and 404. The synchronization pulse 150 can be used by downstream circuits in the clock data recovery circuit 100, such as arithmetic registers 408. For example, the synchronization pulse 150 can be used to register, or even directly process, the digitization of the UP and DOWN signal durations respectively produced by the UP and DOWN time-to-digital converters 112 and 114. In particular, the signal 138 representing the digital difference of the digitized-UP signal and the digitized-DOWN signal can be accumulated, or otherwise processed in the arithmetic registers 408. The digital difference signal 138 is available to further downstream circuits of the clock data recovery circuit 100 based on the arithmetic registers 408 receiving the synchronization pulse 150. By keeping the encoded digital output of the time-to-digital converters 112 and 114 latched until the end of the ensuing doublet to be digitized, a properly balanced UP/DOWN data flow to the downstream circuits of the clock data recovery circuit 100 can be achieved without functional overlaps.

Returning to FIG. 1, the digital difference signal 138 representing the digital difference between the digitized-UP signal 134 and the digitized-DOWN signal 136 is output from the subtractor 116 (or the arithmetic registers of the timing circuit 128) to a digital loop filter 118. The digital loop filter 118 is configured to filter the digital difference signal 138 to generate a filtered signal 140. The digital loop filter 118 can take any suitable form of digital filter to steer the digitally controlled oscillator 120 to accelerate or decelerate its oscillation frequency, and thus align with the phase of the serial data stream 102. In some embodiments, the digital loop filter 118 is configured as a low-pass filter. In some embodiments, the digital loop filter 118 is configured as a proportional-integral filter that is configured to substantially average the digital difference signal to generate the filtered signal 140. In some embodiments, the digital loop filter 118 can comprise a finite impulse response filter or an infinite impulse response filter providing additional pole/zeros. The digital structure of the digital loop filter 118 allows for design flexibility for adding poles and zeros to trade system noise vs. stability. Moreover, gains of the digital loop filter 118, of the digitally controlled oscillator 120, and of the feedback divider 124 (i.e., taken as an ensemble: the loop gain) are programmable due to the digital nature of these components. Such programmable loop gain can contribute to a tradeoff of a convergence speed vs. a locking and holding range of the clock data recovery circuit 100.

The digitally controlled oscillator 120 is configured to receive the filtered signal 140 from the digital loop filter 118 and output a clock signal 122 having a frequency that is steered based on the filtered signal 140, to match the data rate of the serial data stream 102. In the illustrated embodiment, the clock signal is 25 GHz, to match the 25 Gbps input serial data stream. The digitally controlled oscillator 120 can be configured to produce a clock signal having any suitable frequency to match a data rate of any suitable input serial data stream. The digitally controlled oscillator 120 may take any suitable form of digital circuit. In some embodiments, the digitally controlled oscillator 120 can be configured as an LC-tank circuit in order to take advantage of the tight resonance of a passive band-pass filter formed within the oscillator circuit, and therefore minimize phase noise injected into the clock data recovery circuit 100 by thermal noise present in the oscillator. In other embodiments, the digitally controlled oscillator 120 can be configured as a ring oscillator.

The feedback divider 124 can be configured to divide the clock signal 122 according to a designated feedback division factor to generate the feedback signal 126. The feedback division factor typically is set such that the feedback signal 126 has the same frequency as the data rate of the divided serial data stream 106. In the illustrated embodiment, the feedback signal has a frequency of 1.5625 GHz, to match the data rate of the 1.5625 Gbps divided serial data stream.

The embodiment outlined above assumes an identical division ratio at the input of the linear phase detector 110 and the output of the digitally controlled oscillator 120. However, only the data rate of the divided serial data stream 106 and the frequency of the feedback signal 126 typically are required to match, to satisfy the 50% duty cycle constraint imposed by the correct operation of linear phase detector 110. As such, in some embodiments, the feedback divider 124 may have a different division ratio than the bit stream data rate divider 104, to allow for the clock signal 122 to have a different frequency than the data rate of the serial data stream 102. For example, the digitally controlled oscillator 120 can be configured to output a slower clock signal (e.g., :8, :4, :2) and the designated feedback division factor of the feedback divider 124 can be scaled accordingly to match the data rate of the divided serial data stream 106. Such a reduced oscillation frequency can enable a reduction in power consumption of the clock data recovery circuit 100, as well as better phase noise performance and reduced on-chip electromagnetic interference (EMI) phenomena affecting the digitally controlled oscillator 120.

The clock data recovery circuit 100 is configured to internally divide the frequency of an input serial data stream, such that radiation-hardened digital and/or analog circuitry, which have slower data processing capabilities, can be employed in the clock data recovery circuit 100. Besides the resilience to radiation as compared to non-radiation-hardened analog counterparts, the clock data recovery circuit 100 can have a smaller footprint. Additionally, the clock data recovery circuit 100 can be configured to operate at lower speeds with reduced power consumption relative to analog counterparts that are configured to operate at internal speeds that match the frequency of an input serial data stream.

Figure 5:
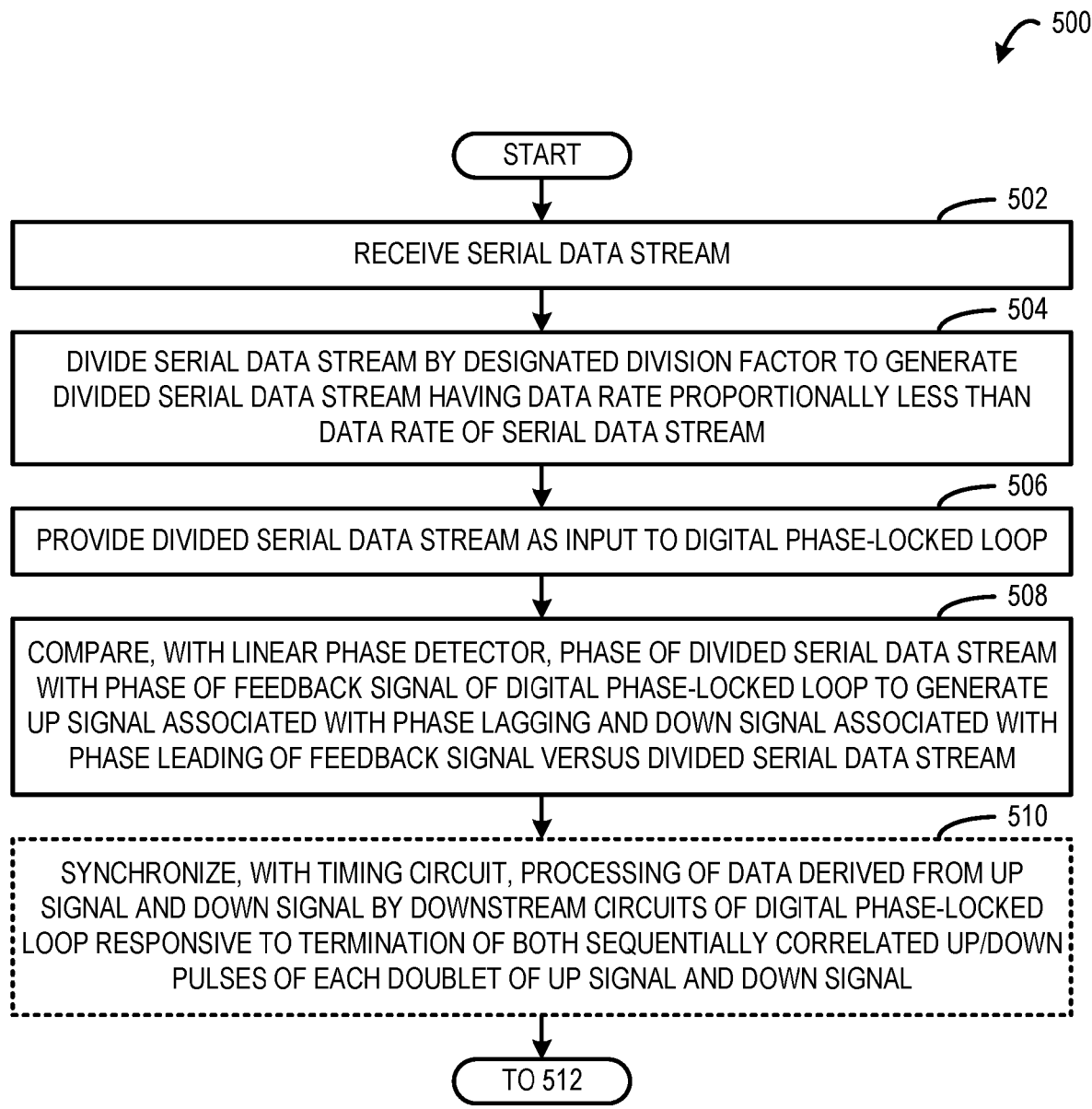
FIGS. 5-6 is a flowchart of an exemplary embodiment of a clock data recovery method.
Figure 6:
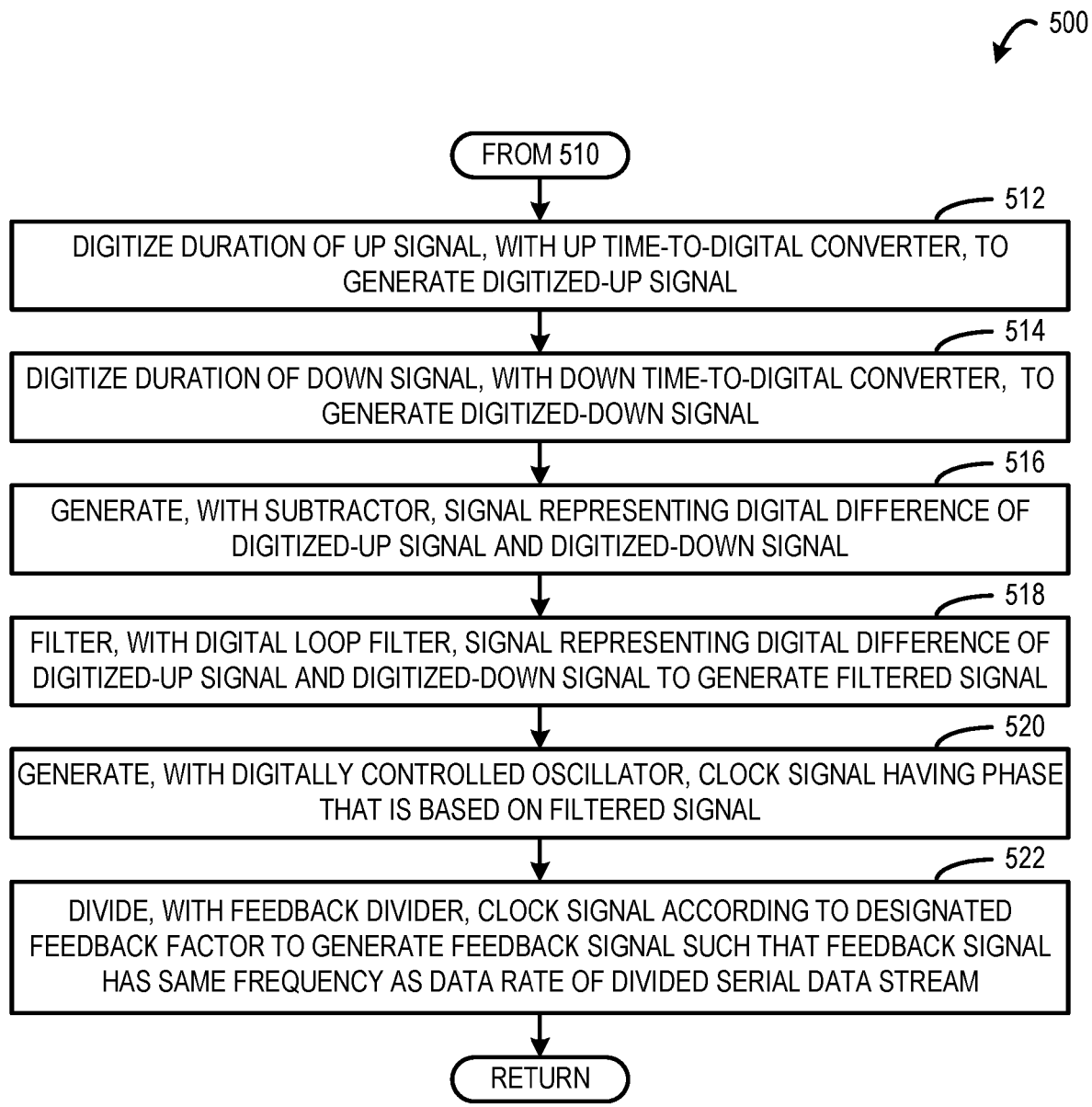

FIGS. 5 and 6 are a flowchart of an exemplary embodiment of a clock data recovery method 500. For example, the method 500 can be performed by the clock data recovery circuit 100 shown in FIG. 1.

In FIG. 5, at 502, the method 500 includes receiving a serial data stream. In some examples, the serial data stream is encoded using a clockless protocol. Example clockless protocols that may be used to encode the serial data stream include 8b10b, 64b66b, and 64b80b protocols. Such clockless protocols can reduce randomness of edges in the serial data stream that allows for quicker and more consistent operation of the clock data recovery circuit.

At 504, the method 500 includes dividing, with a bit stream data rate divider, the serial data stream by a designated division factor to generate a divided serial data stream having a data rate that is proportionally less than a data rate of the serial data. For example, the bit stream data rate divider 104 of the clock data recovery circuit 100 shown in FIG. 1 can perform said dividing.

At 506, the method 500 includes providing the divided serial data stream as input to a digital phase-locked loop comprising a linear phase detector, an UP time-to-digital converter, a DOWN time-to-digital converter, a subtractor, a digital loop filter, a digitally-controlled oscillator, and a feedback divider. For example, the divided serial data stream can be provided to the digital phase-locked loop 108 of the clock data recovery circuit 100 shown in FIG. 1.

At 508, the method 500 includes comparing, with the linear phase detector, a phase of the divided serial data stream with a phase of a feedback signal of the digital phase-locked loop to generate an UP signal associated with phase lagging and a DOWN signal associated with phase leading of the feedback signal versus the divided serial data stream. The UP signal and the DOWN signal can be generated as doublets of sequentially correlated UP/DOWN pulses. For example, the linear phase detector 110 of the clock data recovery circuit 100 shown in FIG. 1 can perform said comparing. In some embodiments, the linear phase detector 110 can include a Hogge phase detector, such as the Hogge phase detector 200 shown in FIG. 2.

In some embodiments, the digital phase-locked loop may include a timing circuit, and at 510, the method 500 optionally may include synchronizing, with the timing circuit, processing of data derived from the UP signal and the DOWN signal by downstream circuits of the digital phase-locked loop responsive to termination of both sequentially correlated UP/DOWN pulses of each doublet. For example, the timing circuit 400 shown in FIG. 4 can perform said synchronizing.

In FIG. 6, at 512, the method 500 includes digitizing, with the UP time-to-digital converter, a duration of the UP signal to generate a digitized-UP signal. For example, the UP time-to-digital converter 112 of the clock data recovery circuit 100 shown in FIG. 1 can perform said digitizing.

At 514, the method 500 includes digitizing, with the DOWN time-to-digital converter, a duration of the DOWN signal to generate a digitized-DOWN signal. For example, the DOWN time-to-digital converter 114 of the clock data recovery circuit 100 shown in FIG. 1 can perform said digitizing.

At 516, the method 500 includes generating, with the subtractor, a signal representing a digital difference of the digitized-UP signal and the digitized-DOWN signal. For example, the subtractor 116 of the clock data recovery circuit 100 shown in FIG. 1 can perform said generating of the digital difference signal.

At 518, the method 500 includes filtering, with the digital loop filter, the digital difference signal to generate a filtered signal. For example, the digital loop filter 118 of the clock data recovery circuit 100 shown in FIG. 1 can perform said filtering. In some embodiments, the digital loop filter may be configured as a low-pass filter. In some embodiments, the digital loop filter may be configured as a proportional integral filter. In some embodiments, the digital loop filter can be configured as a finite impulse response filter or an infinite impulse response filter.

At 520, the method 500 includes generating, with the digitally controlled oscillator, a clock signal having a phase that is based on the filtered signal. In some embodiments, the clock signal may have a frequency that matches a data rate of the input serial data stream. For example, the digitally controlled oscillator 120 of the clock data recovery circuit 100 shown in FIG. 1 can perform said generating.

At 522, the method 500 includes dividing, with the feedback divider, the clock signal according to a designated feedback division factor to generate the feedback signal such that the feedback signal has a same frequency as the data rate of the divided serial data stream. For example, the feedback divider 124 of the clock data recovery circuit 100 shown in FIG. 1 can perform said dividing.

The above described method may be performed to retrieve variable data rate (frequency) and time occurrence (phase) of the serial data bits from the clockless transmission of a serial data stream using radiation-hardened digital and/or analog circuitry.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. A clock data recovery circuit, comprising:
a bit stream data rate divider configured to receive a serial data stream and divide a frequency of the serial data stream by a designated division factor to generate a divided serial data stream having a data rate that is proportionally less than a data rate of the serial data stream; and a digital phase-locked loop including:
a linear phase detector configured to compare a phase of the divided serial data stream with a phase of a feedback signal within the digital phase-locked loop and output an UP signal associated with phase lagging and a DOWN signal associated with phase leading of the feedback signal versus the divided serial data stream;
an UP time-to-digital converter configured to digitize a duration of the UP signal to generate a digitized-UP signal that is registered responsive to termination of the UP signal;
a DOWN time-to-digital converter configured to digitize a duration of the DOWN signal to generate a digitized-DOWN signal that is registered responsive to termination of the DOWN signal;
a subtractor configured to output a signal representing a digital difference between the digitized-UP signal and the digitized-DOWN signal;
a digital loop filter configured to filter the digital difference signal to generate a filtered signal;
a digitally controlled oscillator configured to output a clock signal having a phase that is based on the filtered signal; and
a feedback divider configured to divide the clock signal according to a designated feedback division factor to generate the feedback signal such that the feedback signal has a same frequency as the data rate of the divided serial data stream.

2. The clock data recovery circuit of claim 1, wherein the linear phase detector includes a Hogge phase detector.

3. The clock data recovery circuit of claim 2, wherein the bit stream data rate divider and the feedback divider comprise at least one toggle flip flop configured to provide the divided serial data stream and the feedback signal as inputs to the Hogge phase detector with a substantially 50% duty-cycle.

4. The clock data recovery circuit of claim 2, where the Hogge phase detector is configured to output doublets of sequentially correlated UP/DOWN pulses, wherein for each doublet:
the UP signal includes a pulse generated responsive to a change in state of the divided serial data stream and a reset responsive to a next rising edge of the feedback signal following that change in state of the divided serial data stream; and
the DOWN signal includes a pulse generated responsive to the reset of the pulse included in the UP signal and a reset responsive to a next falling edge of the feedback signal following the reset of the pulse included in the UP signal.

5. The clock data recovery circuit of claim 4, further comprising:
a timing circuit configured to synchronize processing of data derived from the UP signal and the DOWN signal by downstream circuits in the clock data recovery circuit responsive to termination of both sequentially correlated UP/DOWN pulses of each doublet.

6. The clock data recovery circuit of claim 5, wherein the timing circuit is configured to (1) receive the sequentially correlated UP/DOWN pulses of each doublet being output from the Hogge phase detector, (2) hold the sequentially correlated UP/DOWN pulses of each doublet, and (3) generate a synchronization pulse used by the downstream circuits in the clock data recovery circuit.

7. The clock data recovery circuit of claim 6, wherein the synchronization pulse is used to register or otherwise process the digitization of the UP and DOWN signal durations respectively by the UP and DOWN time-to-digital converters such that the digitized-UP signal and the digitized-DOWN signal are made available to downstream circuits of the clock data recovery circuit at substantially the same time.

8. The clock data recovery circuit of claim 1, wherein the digital loop filter is configured as a low-pass filter.

9. The clock data recovery circuit of claim 1, wherein the digital loop filter is a proportional-integral filter configured to substantially average the digital difference signal to generate the filtered signal.

10. The clock data recovery circuit of claim 1, wherein the bit stream data rate divider and the digital phase-locked loop comprise radiation-hardened digital and/or analog circuitry.

11. A clock data recovery circuit, comprising:
a bit stream data rate divider configured to receive a serial data stream and divide a frequency of the serial data stream by a designated division factor to generate a divided serial data stream having a data rate that is proportionally less than a data rate of the serial data stream; and
a digital phase-locked loop including:
a Hogge phase detector configured to compare a phase of the divided serial data stream with a phase of a feedback signal within the digital phase-locked loop and output an UP signal associated with phase lagging and a DOWN signal associated with phase leading of the feedback signal versus the divided serial data stream as doublets of sequentially correlated UP/DOWN pulses, wherein for each doublet:
the UP signal includes a pulse generated responsive to a change in state of the divided serial data stream and a reset responsive to a next rising edge of the feedback signal following that change in state of the divided serial data stream; and
the DOWN signal includes a pulse generated responsive to the reset of the pulse included in the UP signal and a reset responsive to a next falling edge of the feedback signal following the reset of the pulse included in the UP signal;
an UP time-to-digital converter configured to digitize a duration of the UP signal to generate a digitized-UP signal that is registered responsive to termination of the UP signal;
a DOWN time-to-digital converter configured to digitize a duration of the DOWN signal to generate a digitized-DOWN signal that is registered responsive to termination of the DOWN signal;
a subtractor configured to output a signal representing a digital difference between the digitized-UP signal and the digitized-DOWN signal;
a digital loop filter configured to filter the digital difference signal to generate a filtered signal;
a digitally controlled oscillator configured to output a clock signal having a phase that is based on the filtered signal; and
a feedback divider configured to divide the clock signal according to a designated feedback division factor to generate the feedback signal such that the feedback signal has a same frequency as the data rate of the divided serial data stream.

12. The clock data recovery circuit of claim 11, wherein the bit stream data rate divider and the feedback divider comprise at least one toggle flip flop configured to provide the divided serial data stream and the feedback signal as inputs to the Hogge phase detector with a substantially 50% duty-cycle.

13. The clock data recovery circuit of claim 12, further comprising:
a timing circuit configured to synchronize processing of data derived from the UP signal and the DOWN signal by downstream circuits in the clock data recovery circuit responsive to termination of both sequentially correlated UP/DOWN pulses of each doublet.

14. The clock data recovery circuit of claim 13, wherein the timing circuit is configured to (1) receive the sequentially correlated UP/DOWN pulses of each doublet being output from the Hogge phase detector, (2) hold the sequentially correlated UP/DOWN pulses of each doublet, and (3) generate a synchronization pulse used by the downstream circuits in the clock data recovery circuit.

15. The clock data recovery circuit of claim 14, wherein the synchronization pulse is used to register or otherwise process the digitization of the UP and DOWN signal durations respectively by the UP and DOWN time-to-digital converters such that the digitized-UP signal and the digitized-DOWN signal are made available to downstream circuits of the clock data recovery circuit at substantially the same time.

16. The clock data recovery circuit of claim 11, wherein the bit stream data rate divider and the digital phase-locked loop comprise radiation-hardened digital and/or analog circuitry.

17. A clock data recovery method, comprising:
receiving a serial data stream;
dividing the serial data stream by a designated division factor to generate a divided serial data stream having a data rate that is proportionally less than a data rate of the serial data stream;
providing the divided serial data stream as input to a digital phase-locked loop comprising a linear phase detector, an UP time-to-digital converter, a DOWN time-to-digital converter, a subtractor, a digital loop filter, a digitally controlled oscillator, and a feedback divider;
comparing, with the linear phase detector, a phase of the divided serial data stream with a phase of a feedback signal of the digital phase-locked loop to generate an UP signal associated with phase lagging and a DOWN signal associated with phase leading of the feedback signal versus the divided serial data stream;
digitizing, with the UP time-to-digital converter, a duration of the UP signal to generate a digitized-UP signal;
digitizing, with the DOWN time-to-digital converter, a duration of the DOWN signal to generate a digitized-DOWN signal;
generating, with the subtractor, a signal representing a digital difference of the digitized-UP signal and the digitized-DOWN signal;
filtering, with the digital loop filter, the signal representing a digital difference of the digitized-UP signal and the digitized-DOWN signal to generate a filtered signal;
generating, with the digitally controlled oscillator, a clock signal having a phase that is based on the filtered signal; and
dividing, with the feedback divider, the clock signal according to a designated feedback division factor to generate the feedback signal such that the feedback signal has a same frequency as the data rate of the divided serial data stream.

18. The method of claim 17, wherein the linear phase detector includes a Hogge phase detector.

19. The method of claim 18, wherein the UP signal and the DOWN signal are generated as doublets of sequentially correlated UP/DOWN pulses, wherein for each doublet:
the UP signal includes a pulse generated responsive to a change in state of the divided serial data stream and a reset responsive to a next rising edge of the feedback signal following that change in state of the divided serial data stream; and
the DOWN signal includes a pulse generated responsive to the reset of the pulse included in the UP signal and a reset responsive to a next falling edge of the feedback signal following the reset of the pulse included in the UP signal.

20. The method of claim 19, wherein the digital phase-locked loop includes a timing circuit, and the method further comprises synchronizing, with the timing circuit, processing of data derived from the UP signal and the DOWN signal by downstream circuits of the digital phase-locked loop responsive to termination of both sequentially correlated UP/DOWN pulses of each doublet.

* * * * *